(12) United States Patent
Huang

(10) Patent No.: US 10,600,821 B2
(45) Date of Patent: Mar. 24, 2020

(54) ORGANIC LIGHT EMITTING DIODE DISPLAY DEVICE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Hui Huang, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 16/112,025

(22) Filed: Aug. 24, 2018

(65) Prior Publication Data

US 2019/0326551 A1 Oct. 24, 2019

Related U.S. Application Data

(63) Continuation of application No. PCT/CN2018/092351, filed on Jun. 22, 2018.

(30) Foreign Application Priority Data

Apr. 23, 2018 (CN) .......................... 2018 1 0365397

(51) Int. Cl.
*H01L 27/12* (2006.01)
*H01L 51/52* (2006.01)
(Continued)

(52) U.S. Cl.
CPC ...... *H01L 27/1244* (2013.01); *H01L 27/3246* (2013.01); *H01L 51/5253* (2013.01); *H01L 51/56* (2013.01)

(58) Field of Classification Search
CPC . H01L 51/5253; H01L 27/3246; H01L 51/56; H01L 27/1244
See application file for complete search history.

(56) References Cited

U.S. PATENT DOCUMENTS

2002/0081372 A1* 6/2002 Peng ................... H01L 51/5008
427/64
2010/0148192 A1* 6/2010 Jung ................... H01L 27/3246
257/88

(Continued)

FOREIGN PATENT DOCUMENTS

CN 105206763 A 12/2015

*Primary Examiner* — Feifei Yeung Lopez
(74) *Attorney, Agent, or Firm* — Leong C. Lei

(57) ABSTRACT

Provided is an organic light emitting diode display device and a manufacturing method thereof. The method includes: preparing a thin film transistor layer on a glass substrate; preparing a plurality of organic light emitting diode elements on a thin film transistor layer; preparing a barrier layer and a buffer layer on the thin film transistor layer, wherein the barrier layer covers the plurality of organic light emitting diode elements; preparing a plurality of island structures on the barrier layer or on the buffer layer, wherein the plurality of island structures are located a non-light emitting region on the barrier layer or the buffer layer. The path of water vapor entering the OLED display device can be prolonged to enhance the absorption of water vapor and to enhance the packaging result of the OLED display device.

3 Claims, 2 Drawing Sheets

(51) Int. Cl.
*H01L 51/56* (2006.01)
*H01L 27/32* (2006.01)

(56) References Cited

U.S. PATENT DOCUMENTS

2011/0234088 A1* 9/2011 Abe .................... G02B 5/0215
313/504
2018/0047946 A1* 2/2018 Tsuda ...................... H01L 51/56

* cited by examiner

ORGANIC LIGHT EMITTING DIODE DISPLAY DEVICE AND MANUFACTURING METHOD THEREOF

CROSS-REFERENCE TO RELATED APPLICATION

This application is a continuing application of PCT Patent Application No. PCT/CN2018/092351 entitled "Organic light emitting diode display device and manufacturing method thereof", filed on Jun. 22, 2018, which claims priority to Chinese Patent Application No. 201810365397.2, filed on Apr. 23, 2018, both of which are hereby incorporated in its entireties by reference.

FIELD OF THE INVENTION

The present invention relates to a display field, and more particularly to an organic light emitting diode display device and a manufacturing method thereof.

BACKGROUND OF THE INVENTION

In the current field of lighting and display, due to the properties of the OLED (Organic Light-Emitting Diode), such as low start-up voltage, lightness, thinness and self-luminescence, more and more OLEDs are widely studied for the development of lighting products and panel industry to meet the requirements of low energy consumption, light weight and surface light sources. At present, due to the properties of flexibility, thinness, and self-luminescence of the OLED flexible display panel, more and more OLED flexible display products are created.

At present, the structure of the OLED display device is performed by using a thin film package as shown in FIG. 1. The numbers 1', 2', 3', 4', 5', 6', 7' and 8' respectively indicate the glass substrate and the TFT (Thin Film Transistor) layer, the pixel layer, the first barrier layer, the first buffer layer, the second barrier layer, the second buffer layer and the third barrier layer. However, since the thin film barrier layer and the buffer layer are thin, there is a stress between the layers. Therefore, the ability of the barrier layer and the buffer layer for blocking water and oxygen does not achieve the desired effect. The water-oxygen permeability is high, and the barrier layer and the buffer layer are more likely to break and cause the package to fail.

SUMMARY OF THE INVENTION

For solving the aforesaid technical problems, the present invention provides an organic light emitting diode display device and a manufacturing method thereof, which can reduce the permeability of water and oxygen for lowering the risk of breakage of the barrier layer and the buffer layer, and improving the service life of the OLED display device.

The present invention provides a manufacturing method of an organic light emitting diode display device, comprising:
preparing a thin film transistor layer on a glass substrate;
preparing a plurality of organic light emitting diode elements on a thin film transistor layer;
preparing a barrier layer and a buffer layer on the thin film transistor layer, wherein the barrier layer covers the plurality of organic light emitting diode elements;
preparing a plurality of island structures on the barrier layer or on the buffer layer, wherein the plurality of island structures are located a non-light emitting region on the barrier layer or the buffer layer.

Preferably, preparing the plurality of island structures on the barrier layer or on the buffer layer specifically comprises:
patterning the barrier layer or the buffer layer by one of photolithography, transferring and laser etching to obtain the plurality of island structures, or preparing the plurality of island structures on the barrier layer or the buffer layer by inkjet printing.

Preferably, as the plurality of island structures are prepared on the barrier layer or the buffer layer by inkjet printing, a material of the island structures is an inorganic nanomaterial.

Preferably, a shape of the island structure is one of a pyramid shape, a lens shape and a particle shape.

Preferably, preparing the barrier layer and the buffer layer on the thin film transistor layer specifically comprises:
sequentially preparing a first barrier layer, a first buffer layer, a second barrier layer, a second buffer layer and a third barrier layer on the thin film transistor layer.

Preferably, preparing the plurality of island structures on the barrier layer or on the buffer layer specifically comprises:
preparing the plurality of island structures on any one of the first barrier layer, the first buffer layer, the second barrier layer, the second buffer layer and the third barrier layer.

The present invention further provides a manufacturing method of an organic light emitting diode display device, comprising:
preparing a thin film transistor layer on a glass substrate;
preparing a plurality of organic light emitting diode elements on a thin film transistor layer;
preparing a barrier layer and a buffer layer on the thin film transistor layer, wherein the barrier layer covers the plurality of organic light emitting diode elements;
preparing a plurality of island structures on the barrier layer or on the buffer layer, wherein the plurality of island structures are located a non-light emitting region on the barrier layer or the buffer layer; wherein a shape of the island structure is one of a pyramid shape, a lens shape and a particle shape;
preparing the plurality of island structures on the barrier layer or on the buffer layer specifically comprises:
patterning the barrier layer or the buffer layer by one of photolithography, transferring and laser etching to obtain the plurality of island structures, or preparing the plurality of island structures on the barrier layer or the buffer layer by inkjet printing.

Preferably, as the plurality of island structures are prepared on the barrier layer or the buffer layer by inkjet printing, a material of the island structures is an inorganic nanomaterial.

Preferably, preparing the barrier layer and the buffer layer on the thin film transistor layer specifically comprises:
sequentially preparing a first barrier layer, a first buffer layer, a second barrier layer, a second buffer layer and a third barrier layer on the thin film transistor layer.

Preferably, preparing the plurality of island structures on the barrier layer or on the buffer layer specifically comprises:
preparing the plurality of island structures on any one of the first barrier layer, the first buffer layer, the second barrier layer, the second buffer layer and the third barrier layer.

The present invention further provides an organic light emitting diode display device, comprising: a glass substrate, a thin film transistor layer located on the glass substrate, a plurality of organic light emitting diode elements located on the thin film transistor layer, a barrier layer and a buffer layer located on the thin film transistor layer, wherein the barrier layer covers the plurality of organic light emitting diode elements;

wherein a plurality of island structures is arranged on the barrier layer or on the buffer layer, and the plurality of island structures are located in a non-light emitting region on the barrier layer or the buffer layer.

Preferably, a shape of the island structure is one of a pyramid shape, a lens shape and a particle shape.

Preferably, a material of the island structures is the same as a material of the barrier layer or the buffer layer, or the material of the island structures is an inorganic nanomaterial.

Preferably, the barrier layer comprises a first barrier layer, a second barrier layer, and a third barrier layer, and the buffer layer comprises a first buffer layer and a second buffer layer;

the first barrier layer, the first buffer layer, the second barrier layer, the second buffer layer and the third barrier layer are sequentially stacked in a direction away from the thin film transistor layer.

The implementation of the present invention possesses results: by preparing the plurality of island structures on the barrier layer or the buffer layer according to the present invention, the path of water vapor entering the OLED display device will be prolonged to enhance the absorption of water vapor and to reduce the water vapor-oxygen permeability for enhancing the packaging result of the OLED display device. Meanwhile, the stress of the OLED display device can be enhanced, and the film damage caused by the stress of the display device can be effectively reduced.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
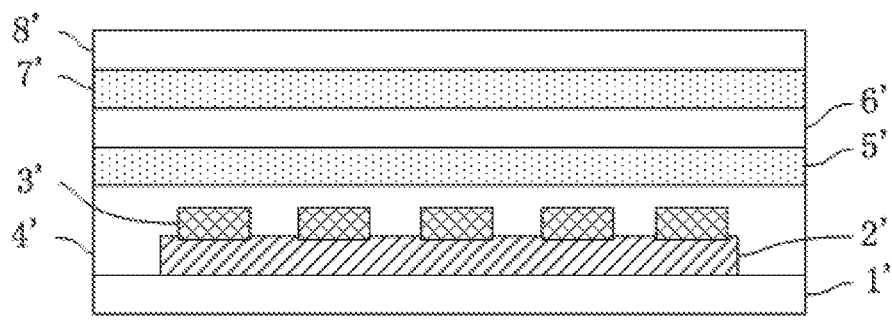
FIG. 1 is a structural diagram of an organic light emitting diode display device in the prior art of the present invention.
Figure 2:
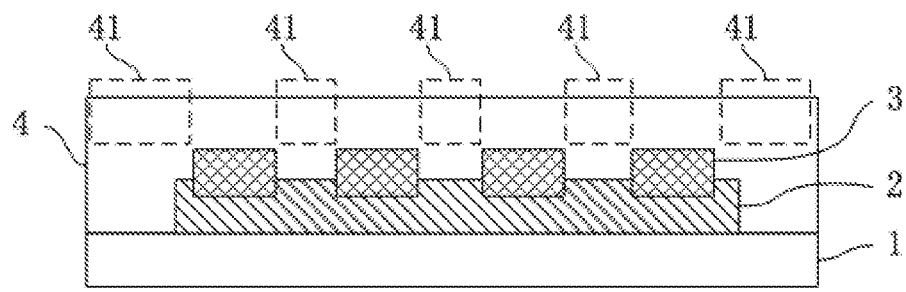
FIG. 2 is a structure diagram of a thin film transistor layer, organic light emitting diode display elements and a first barrier layer prepared on a glass substrate according to the present invention.
Figure 3:
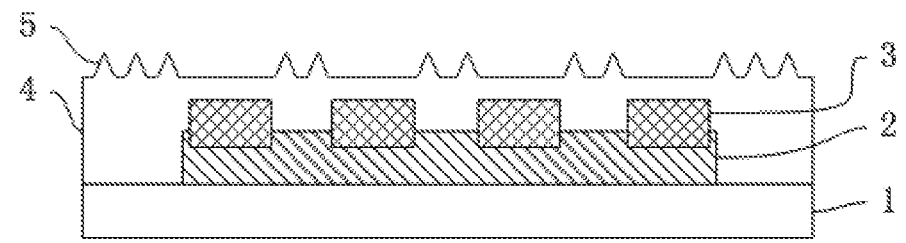
FIG. 3 is a diagram of a plurality of island structures prepared on a first barrier layer according to the present invention.

The present invention provides a method for preparing an OLED (Organic Light-Emitting Diode) display device. The method comprises;

as shown in FIG. 2, preparing a TFT (thin film transistor) layer 2 on a glass substrate 1;

preparing a plurality of organic light emitting diode elements 3 on a thin film transistor layer 2;

preparing a barrier layer and a buffer layer on the thin film transistor layer 2, wherein the barrier layer covers the plurality of organic light emitting diode elements 3;

preparing a plurality of island structures on the barrier layer or on the buffer layer, wherein the plurality of island structures are located a non-light emitting region on the barrier layer or the buffer layer. For instance, as shown in FIG. 3, the plurality of island structures 5 are prepared on a first barrier layer 4 on the thin film transistor layer 2. As shown in FIG. 2, the non-light emitting region 41 is a region on the barrier layer outside a region directly above the organic light emitting diode display elements 3 as shown in the dashed frame area in FIG. 2; correspondingly, the light emitting region is a region on the barrier layer directly above the organic light emitting diode display elements 3. The light emitting region is a pixel region corresponding to the organic light emitting diode display device.

Furthermore, preparing the plurality of island structures on the barrier layer or on the buffer layer specifically comprises:

patterning the barrier layer or the buffer layer by one of photolithography, transferring and laser etching to obtain the plurality of island structures 5, or preparing the plurality of island structures 5 on the barrier layer or the buffer layer by inkjet printing. Specifically, photolithography is performed by coating photoresist, exposing and developing, and laser etching is directly etching by laser irradiation in positions where etching is required.

Furthermore, as the plurality of island structures 5 are prepared on the barrier layer or the buffer layer by inkjet printing, a material of the island structures 5 is an inorganic nanomaterial.

Figure 4:
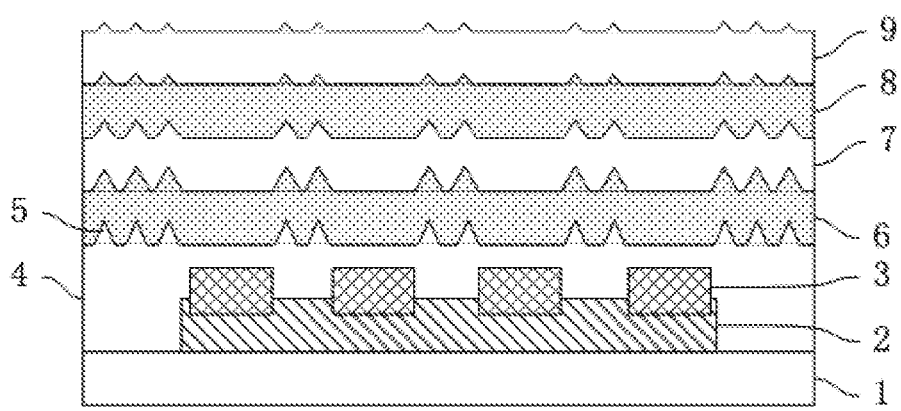
FIG. 4 is a structure diagram of an organic light emitting diode display device according to the present invention.

As shown in FIG. 4, preparing the barrier layer and the buffer layer on the thin film transistor layer 2 specifically comprises:

sequentially preparing a first barrier layer 4, a first buffer layer 6, a second barrier layer 7, a second buffer layer 8 and a third barrier layer 9 on the thin film transistor layer 2.

Furthermore, preparing the plurality of island structures on the barrier layer or on the buffer layer specifically comprises:

preparing the plurality of island structures 5 on any one of the first barrier layer 4, the first buffer layer 6, the second barrier layer 7, the second buffer layer 8 and the third barrier layer 9. In FIG. 3, the plurality of island structures 5 is prepared on the first barrier layer 4. In other embodiments, the plurality of island structures 5 can be prepared on the first buffer layer 6 or on the second barrier layer 7.

Since the first barrier layer 4, the first buffer layer 6, the second barrier layer 7, the second buffer layer 8 and the third barrier layer 9 are generally prepared by chemical vapor deposition, thus as the plurality of island structures 5 is prepared on the first barrier layer 4, the first buffer layer 6, the second barrier layer 7, the second buffer layer 8 and the third barrier layer 9 are all convex upwards corresponding to the island structures 5.

When water vapor enters the organic light emitting diode display device, and as the water vapor passes through the positions where the first buffer layer 6, the second barrier layer 7, the second buffer layer 8, and the third barrier layer 9 are convex upwards corresponding to the island structures 5, and passes through the island structures 5, the path of water vapor entering the OLED display device will be prolonged to enhance the absorption of water vapor and to reduce the water vapor-oxygen permeability for enhancing the packaging result of the OLED display device. Meanwhile, the stress of the OLED display device can be enhanced, and the film damage caused by the stress of the display device can be effectively reduced, and the island structures 5 prepared in the non-light emitting region 41 will not adversely affect the light-emitting result (such as total reflection, light absorption, etc.).

Figure 5:
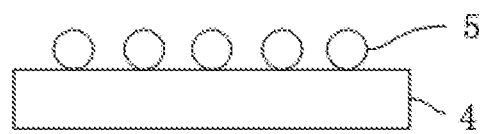
FIG. 5 is a diagram of particle shape island structures according to the present invention.
Figure 6:
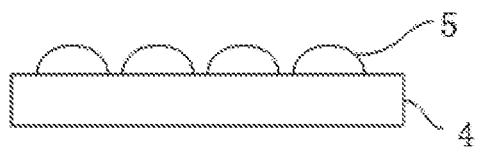
FIG. 6 is a diagram of lens shape island structures according to the present invention.

A shape of the island structure 5 is one of a pyramid shape, a lens shape and a particle shape. As shown in FIG. 3, the shape of the island structure 5 is the pyramid shape. As shown in FIG. 5, the shape of the island structure 5 can be the particle shape. As shown in FIG. 6, the shape of the island structure 5 can be the lens shape. The island structures 5 of the particle shape can be prepared by inkjet printing. When the island structures 5 of the particle shape are prepared by inkjet printing, the material of the island structures 5 is selected to use an inorganic nanomaterial, such as one of magnesium oxide, zinc oxide and titanium dioxide. When the inorganic nanomaterial is used, the process is simple and the cost is low. The pyramid shape island structures 5 or the lens shape island structures 5 can be prepared by photolithography, transferring, or laser etching.

The present invention further provides an organic light emitting diode display device. As shown in FIG. 4, the OLED display device comprises: a glass substrate 1, a thin film transistor layer 2 located on the glass substrate 1, a plurality of organic light emitting diode elements 3 located on the thin film transistor layer 2, a barrier layer and a buffer layer located on the thin film transistor layer 2, wherein the barrier layer covers the plurality of organic light emitting diode elements 3.

The barrier layer comprises a first barrier layer 4, a second barrier layer 7 and the third barrier layer 9. The buffer layer comprises a first buffer layer 6 and a second buffer layer 8.

The first barrier layer 4, the first buffer layer 6, the second barrier layer 7, the second buffer layer 8 and the third barrier layer 9 are sequentially stacked in a direction away from the thin film transistor layer 2.

A plurality of island structures 5 is arranged on the barrier layer or on the buffer layer, and the plurality of island structures 5 are located in a non-light emitting region 41 on the barrier layer or the buffer layer. For instance, the plurality of island structures 5 is arranged on the first barrier layer 4.

Furthermore, a shape of the island structure 5 is one of a pyramid shape, a lens shape and a particle shape.

Furthermore, a material of the island structures 5 is the same as a material of the barrier layer or the buffer layer, or the material of the island structures 5 is an inorganic nanomaterial.

In conclusion, by preparing the plurality of island structures 5 on the barrier layer or the buffer layer according to the present invention, the path of water vapor entering the OLED display device will be prolonged to enhance the absorption of water vapor and to reduce the water vapor-oxygen permeability for enhancing the packaging result of the OLED display device. Meanwhile, the stress of the OLED display device can be enhanced, and the film damage caused by the stress of the display device can be effectively reduced, and the island structures 5 prepared in the non-light emitting region 41 will not adversely affect the light-emitting result (such as total reflection, light absorption, etc.).

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deduction or replacement, should be deemed to belong to the scope of the present invention.

What is claimed is:

1. A manufacturing method of an organic light emitting diode display device, comprising:
    preparing a thin film transistor layer on a glass substrate;
    preparing a plurality of organic light emitting diode elements on a thin film transistor layer;
    preparing a barrier layer and a buffer layer on the thin film transistor layer, wherein the barrier layer covers the plurality of organic light emitting diode elements;
    preparing a plurality of island structures on the barrier layer or on the buffer layer, wherein the plurality of island structures are located a non-light emitting region on the barrier layer or the buffer layer; wherein a shape of the island structure is one of a pyramid shape, a lens shape and a particle shape;
    preparing the plurality of island structures on the barrier layer or on the buffer layer specifically comprises:
    patterning the barrier layer or the buffer layer by one of photolithography, transferring and laser etching to obtain the plurality of island structures, or preparing the plurality of island structures on the barrier layer or the buffer layer by inkjet printing;
    wherein as the plurality of island structures are prepared on the barrier layer or the buffer layer by inkjet printing, a material of the island structures is an inorganic nanomaterial.

2. The manufacturing method of the organic light emitting diode display device according to claim 1, wherein preparing the barrier layer and the buffer layer on the thin film transistor layer comprises:
    sequentially preparing a first barrier layer, a first buffer layer, a second barrier layer, a second buffer layer and a third barrier layer on the thin film transistor layer.

3. The manufacturing method of the organic light emitting diode display device according to claim 2, wherein preparing the plurality of island structures on the barrier layer or on the buffer layer comprises:
    preparing the plurality of island structures on any one of the first barrier layer, the first buffer layer, the second barrier layer, the second buffer layer and the third barrier layer.

* * * * *